(12) United States Patent
Bergmann et al.

(10) Patent No.: US 12,117,471 B2
(45) Date of Patent: Oct. 15, 2024

(54) ADAPTER FOR AN ENERGY METER AND ENERGY MEASUREMENT DEVICE

(71) Applicant: Phoenix Contact GmbH & Co. KG, Blomberg (DE)

(72) Inventors: Florian Bergmann, Holzminden (DE); Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 537 days.

(21) Appl. No.: 17/434,594

(22) PCT Filed: Feb. 26, 2020

(86) PCT No.: PCT/EP2020/055026
§ 371 (c)(1),
(2) Date: Aug. 27, 2021

(87) PCT Pub. No.: WO2020/174004
PCT Pub. Date: Sep. 3, 2020

(65) Prior Publication Data
US 2022/0137108 A1 May 5, 2022

(30) Foreign Application Priority Data
Feb. 27, 2019 (DE) .......................... 102019105017.0

(51) Int. Cl.
*H01R 13/66* (2006.01)
*G01R 22/06* (2006.01)
*H01R 31/06* (2006.01)

(52) U.S. Cl.
CPC ......... *G01R 22/065* (2013.01); *H01R 13/665* (2013.01); *H01R 31/06* (2013.01)

(58) Field of Classification Search
CPC ...... H01R 4/28; H01R 13/112; H01R 13/665; H01R 31/06; H02B 1/03; H02B 1/50; G01R 22/065
See application file for complete search history.

(56) References Cited

U.S. PATENT DOCUMENTS 4,977,482 A 12/1990 Langdon et al.
5,572,396 A * 11/1996 Robinson ................. G01R 1/36
361/127

(Continued)

FOREIGN PATENT DOCUMENTS

DE 3634667 A1 4/1988
DE 202004002731 U1 4/2004

(Continued)

OTHER PUBLICATIONS

Authorized Officer: O'Callaghan, D, International Search Report issued in counterpart PCT application No. PCT/EP2020/055026, Jun. 3, 2020, 12 pp.

(Continued)

*Primary Examiner* — Thanh Tam T Le
(74) *Attorney, Agent, or Firm* — Kaplan Breyer Schwarz, LLP (57) ABSTRACT

An adapter for an energy meter, has a voltage converter, at least two first electrical terminals for connecting to respective conductors of a power network and at least two second electrical terminals to which an energy meter can be electrically connected. The voltage converter is electrically connected to the at least two first electrical terminals and the at least two second terminals and converts a first voltage, which can be applied to the at least two first electrical terminals, into a lower second voltage that is applied to the at least two second electrical terminals, where the voltage ratio between the first and the second voltage is predetermined and can be stored in an energy meter. There is a first (Continued)

distance between the at least two first electrical terminals that is greater than a second distance between the at least two second electrical terminals.

8 Claims, 5 Drawing Sheets

(56) References Cited

U.S. PATENT DOCUMENTS

| | | | | |
|---|---|---|---|---|
| 6,983,211 B2* | 1/2006 | Macfarlene | ............ | H05K 3/3447 |
| | | | | 324/107 |
| 6,997,739 B2* | 2/2006 | Hoxha | ............ | H01R 13/42 |
| | | | | 439/518 |
| 7,040,920 B2* | 5/2006 | Johnson, Jr. | ............ | G01R 22/065 |
| | | | | 439/146 |
| 7,611,366 B2* | 11/2009 | Davis | ............ | G01R 11/04 |
| | | | | 361/633 |
| 7,857,660 B2* | 12/2010 | Austin | ............ | G01R 11/04 |
| | | | | 439/517 |
| 7,905,748 B2* | 3/2011 | Benke | ............ | H01R 31/06 |
| | | | | 361/641 |
| 8,721,363 B2* | 5/2014 | Garwood | ............ | H01R 33/945 |
| | | | | 439/146 |
| 8,784,130 B2* | 7/2014 | Scott | ............ | H01R 33/945 |
| | | | | 439/640 |
| 8,837,101 B2 | 9/2014 | Rouaud | | |
| 9,391,414 B2* | 7/2016 | Seals | ............ | H01R 31/065 |
| 9,500,672 B1* | 11/2016 | Bautista | ............ | H01R 33/94 |
| 10,020,627 B1* | 7/2018 | Olson | ............ | H01R 13/447 |
| 10,132,838 B2* | 11/2018 | Parks | ............ | G01R 3/00 |
| 10,620,242 B2* | 4/2020 | Olson | ............ | G01R 22/065 |
| 10,770,254 B2* | 9/2020 | Rout | ............ | H01R 25/16 |
| 10,886,638 B1* | 1/2021 | McCarthy | ............ | H01R 9/22 |
| 2008/0284614 A1 | 11/2008 | Perez et al. | | |
| 2010/0271234 A1 | 10/2010 | Moulard | | |
| 2016/0274150 A1 | 9/2016 | Ordanis | | |

FOREIGN PATENT DOCUMENTS

| | | |
|---|---|---|
| DE | 102009050184 B4 | 10/2012 |
| DE | 202012010818 U1 | 11/2012 |
| DE | 102012022132 A1 | 5/2014 |
| DE | 102018106940 A1 | 9/2019 |
| EP | 2232204 B1 | 10/2011 |
| EP | 2901166 B1 | 8/2018 |
| GB | 2501377 A | 10/2013 |
| WO | 99/47935 A1 | 9/1999 |
| WO | 2003/012462 A1 | 2/2003 |
| WO | 2015/024068 A1 | 2/2015 |
| WO | 2018/015202 A1 | 1/2018 |

OTHER PUBLICATIONS

Digi-Key Electronics: Product list terminal blocks, htpps://www.digikey.de/product-detail/de/phoenix-contact/1985292/277-1632-ND, Nov. 6, 2019.

Office Action issued in counterpart German patent application No. 102019105017.0, Nov. 6, 2019, 10 pp. w/ translation.

* cited by examiner

ADAPTER FOR AN ENERGY METER AND ENERGY MEASUREMENT DEVICE

FIELD

The invention relates to an adapter for an energy meter and to a device for energy measurement and in particular for measuring the current and voltage of a current-carrying conductor.

BACKGROUND

In order to obtain information about energy consumption in industrial areas, the required current can be measured using the magnetic field of a current-carrying conductor and the voltage between two conductors in an energy meter.

Such an energy meter is known, for example, from DE 10 2018 106 940 A1. A device for measuring electrical energy consumption is also described in DE 10 2009 050 184 B4. The known measuring device has a base part and a processor part that can be connected to this base part, an electrical connection device being provided between the base part and the processor part. The electrical terminals for connecting the measuring device are all located on the base part.

The known energy meters are each designed for a predetermined dielectric strength that must comply with standards and guidelines. Dielectric strength refers to the greatest electrical field strength that may prevail in a material without a voltage breakdown occurring. The method for determining dielectric strength is defined in the IEC 60243 series of standards. In the energy meters, therefore, predetermined clearances and creepage distances must be maintained between electrically conductive components. This means that only voltages up to a defined upper voltage limit can be measured with the known energy meters, due to their limited dielectric strength.

A smart meter is known from DE 10 2012 022 132 A1, the electronics of which have three circuits, specifically a primary circuit, a secondary circuit, and a measuring circuit. In order to guarantee the required overvoltage protection, it is provided that the measuring circuit has protective insulation with an insulation strength of at least 3 kV in relation to both the primary circuit and the secondary circuit, wherein the sum of the insulation strengths of the two protective insulations is at least 8 kV and the secondary circuit has protective insulation of 8 kV relative to the primary circuit.

SUMMARY

The underlying object of the invention is to provide an adapter and an energy measurement device which make it possible to use an energy meter having a defined dielectric strength even in environments which would require meters with a higher dielectric strength.

The above-mentioned technical problem is solved by the features of claim 1.

Accordingly, an adapter for an energy meter is provided, wherein the adapter has a voltage converter, at least two first electrical terminals for connecting to respective conductors of a power network and at least two second electrical terminals to which an energy meter can be electrically connected, wherein the voltage converter is electrically connected to the at least two first electrical terminals and the at least two second terminals and converts a first voltage, which can be applied to the at least two first electrical terminals, to a lower second voltage that is applied to the at least two second electrical terminals, wherein the voltage ratio between the first and the second voltage is predetermined and can be stored in an energy meter, wherein there is a distance d1 between the at least two first electrical terminals that is greater than the distance d2 between the at least two second electrical terminals.

In order to enable a compact and space-saving design, the adapter can advantageously have a receiving region which is designed to connect an energy meter to the adapter in a mechanically detachable manner.

The above-mentioned technical problem is solved by the features of claim 3.

Accordingly, an energy measurement device is provided which has an energy meter and an adapter which can be mechanically connected to the energy meter in a detachable manner. The energy meter has at least two first electrical terminals for connecting to respective conductors of a power network, and at least one electrical terminal pair for connecting an external current sensor. The energy meter is a meter which is designed in particular to be able to be connected directly to a power network in order to measure the currents flowing in the current-carrying conductors of the power network and the voltages within between the conductors of the power network. The adapter has a voltage converter, at least two second electrical terminals for connecting to respective conductors of a power network and at least two third electrical terminals which can be electrically connected to the at least two first electrical terminals of the energy meter. The voltage converter is electrically connected to the at least two second electrical terminals and the at least two third terminals. It is also designed to convert a first voltage which can be applied to the at least two second electrical terminals to a lower second voltage that is applied to the at least two third electrical terminals. The voltage ratio between the first and the second voltage is predetermined and stored in the energy meter. There is a distance d1 between the at least two electrical terminals that is greater than the distance d2 between the at least two third electrical terminals.

Due to the adapter, it is possible to increase the dielectric strength of the energy measurement device relative to the dielectric strength of the energy meter used. This also makes it possible to use the energy meter to measure voltages for which the energy meter is not designed due to its predetermined dielectric strength.

Advantageous developments are the subject matter of the dependent claims.

To make possible a compact and space-saving design of the device, the adapter can have a receiving region which is designed to connect the energy meter to the adapter in a mechanically detachable manner, wherein in the mounted state, i.e., when the adapter and the energy meter are mechanically coupled to one another, the overall width and overall height of the energy measurement device determined by the width and overall height of the adapter. This is achieved in particular in that, due to the receiving region, the energy meter can be detachably attached to the adapter.

According to one advantageous development, the adapter is arranged in a housing, the receiving region being defined by the profile of the housing. A mounting rail can be arranged in the receiving region, wherein the energy meter can be designed for mounting on the mounting rail of the adapter. In addition, the housing of the adapter can be designed for mounting on a mounting rail.

Due to this design, the energy measurement device can be snapped onto a mounting rail, for example a top-hat rail, in a space-saving manner, for example in a control cabinet.

One useful development provides that the distance between the at least two first electrical terminals of the energy meter equals the distance d2 between the at least two third electrical terminals.

One useful development provides that the energy meter has three first terminal pairs for connecting one current sensor each and four first electrical terminals, wherein every two adjacent terminals of the four first terminals are spaced apart by the distance d2. Furthermore, the adapter can have four second electrical terminals and four third electrical terminals, wherein every two adjacent terminals of the four second terminals are spaced apart by the distance d1 and every two adjacent terminals of the four third terminals are spaced apart by the distance d2.

BRIEF DESCRIPTION OF THE DRAWINGS

The invention is explained in more detail below with reference to exemplary embodiments in conjunction with the accompanying drawings, in which.

DETAILED DESCRIPTION

Figure 1:
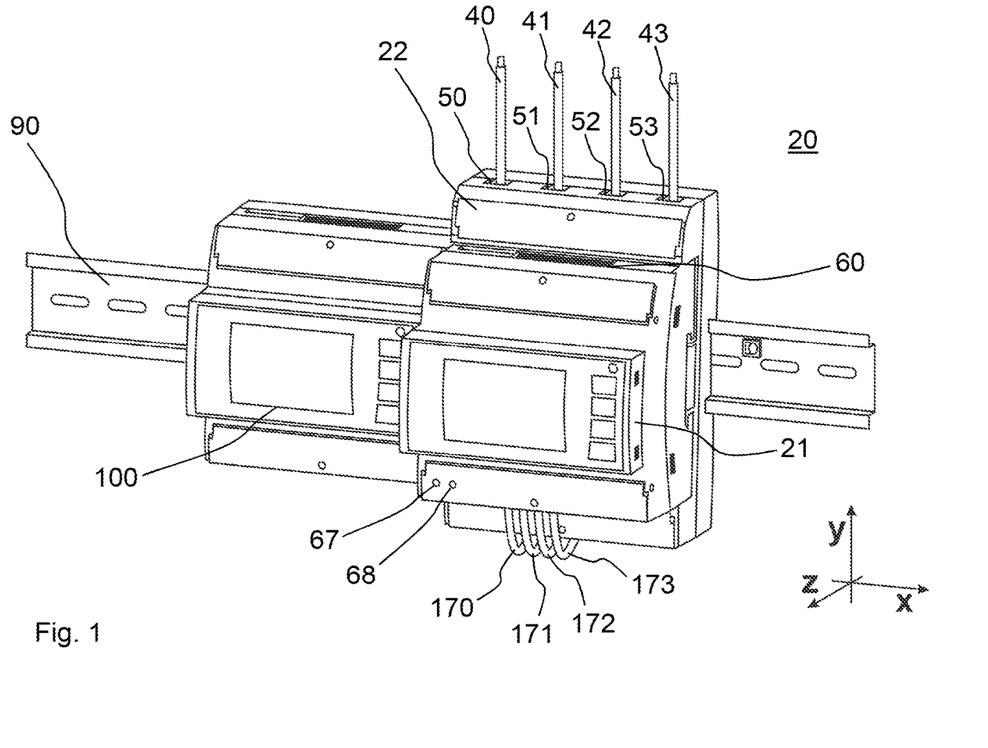
FIG. 1 depicts an exemplary arrangement of an inventive energy measurement device and a conventional energy meter, which are mounted on a mounting rail.

FIG. 1 is a perspective illustration of an exemplary installation for energy measurement, wherein an energy meter 100 is shown which is snapped directly onto a mounting rail 90 and can be connected to a power network (not shown). Furthermore, an exemplary energy measurement device 20 is shown which has an energy meter 21 and an adapter 22, the energy meter 21 being mechanically and detachably mounted onto or on the adapter 22. The adapter 22 can also be snapped onto the mounting rail 90. It should be noted that the meter 21 can be structurally and functionally identical to the energy meter 100. This means that the energy meter 21 could also be connected directly, that is, without an adapter 22, to a power network for measuring current and voltage.

As can also be seen in FIG. 1, when mounted, the energy measurement device 20, i.e. the energy meter 21, is mechanically detachably attached to the adapter 22, and has an overall width and an overall height which are determined by the overall width and the overall height of the adapter 22. The overall width of the device, the adapter, and the energy meter 21 is measured in the x-direction of the coordinate system shown in FIG. 1, while the overall height is measured in the y-direction of the coordinate system shown in FIG. 1. The longitudinal axis of the mounting rail 90 shown in FIG. 1 runs parallel to the x-axis of the coordinate system shown in FIG. 1. In this way, a compact and space-saving assembly is created which forms the energy measurement device 20. This is because the adapter 22 and the energy meter lie one above the other or one behind the other with respect to the z-axis of the coordinate system shown in FIG. 1.

Figure 3:
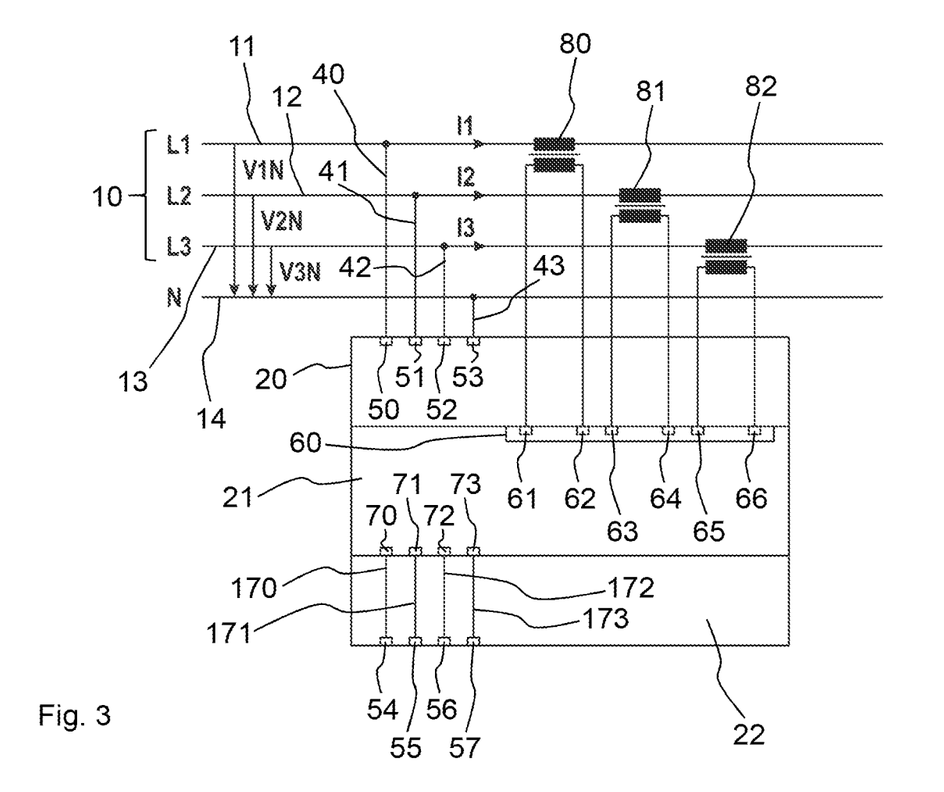
FIG. 3 is a schematic plan view of the energy measurement device shown in FIG. 1, which device is connected to a power network.

In FIG. 1, four electrical connection lines 170 to 173 are shown by way of example, and, as can be seen more clearly in FIG. 3, in the present example, connect four electrical terminals 54 to 57 of the adapter 22 to four electrical terminals 70 to 73 of the energy meter 21.

Furthermore, four electrical terminals 50 to 53 of the adapter 22 are shown by way of example in FIG. 1, and can be connected via four connecting lines 40 to 43 to three phase conductors 11 to 13 and a neutral conductor 14 of a power network 10, which is shown in FIG. 3. Although the power network 10 shown in FIG. 3 can be an exemplary three-phase low-voltage network, the power network 10 can be implemented using any one-phase or multi-phase power network. Furthermore, in a manner known per se, the energy meter 21 has a connection region 60 which has at least one electrical terminal pair for connecting a current sensor. By way of example, the energy meter 21 has three electrical terminal pairs with terminals 61 to 66, which can each be connected to a current sensor 80, 81 or 82, as is shown in FIG. 3.

FIG. 3 will now be considered in more detail.

The energy meter 21 has at least two first electrical terminals for connecting to one conductor each of the power network 10. Since the exemplary power network 10 has four conductors, specifically the three phase conductors 11 to 13 and the neutral conductor 14, in the present example the energy meter 21 has the four first terminals 50 to 53, already mentioned in connection with FIG. 1. In the exemplary installation shown in FIG. 3, the electrical terminal 50 is connected to the phase conductor 11 via the connection line 40, the electrical terminal 51 is connected to the phase conductor 12 via the connection line 41, the electrical terminal 52 is connected to the third phase conductor 13 via the connection line 52, and the terminal 53 is connected to the neutral conductor 14 of the power network 10 via the connecting line 43. As already mentioned above, the four first electrical terminals 70 to 73 of the energy meter 21 are not connected directly to the conductors 11 to 14 of the power network 10, but instead are connected electrically via the connecting lines 170 to 173 to the third terminals 54 to 57 of the adapter 22. In a manner known per se, the energy meter 21 has at least one first electrical terminal pair for connecting an external current sensor and preferably has a second electrical terminal pair 67, 68 for connecting an external supply voltage for the energy meter 21. In the exemplary embodiment shown, three first electrical terminal pairs are provided, specifically the first terminal pair with the terminals 61 and 62, the second terminal pair with the terminals 63 and 64, and the third terminal pair with the terminals 65 and 66. The first electrical terminal pair is electrically connected to a current sensor 80 which is connected to the first phase conductor 11, the second terminal pair is connected to a second current sensor 81 which is connected to the second phase conductor 12, while the third terminal pair is electrically connected to a further current sensor 82 which is looped into the third phase conductor 13. As shown by way of example in FIG. 3, the current sensors 80 to 82 can each be designed as current transformers. The current flowing in the phase conductors 11 to 13 is fed directly to the energy meter via the current sensors 80 to 82.

The adapter 22 has at least two second electrical terminals for connecting to one conductor each of a power network. In the exemplary installation according to FIGS. 1 and 2, the adapter 22 has the four second electrical terminals 50 to 53. The electrical terminal 50 is connected to the first phase conductor 11 via the connecting line 40, the electrical terminal 51 is connected to the second phase conductor 12 via the connecting line 41, the electrical terminal 52 is connected to the third phase conductor 13 via the connecting line 42, while the terminal 53 is connected to the neutral conductor 14 of the power network via the connecting line 43. In this way, the voltage V1N, which is applied between the first phase conductor 11 and the neutral conductor 14, a second voltage V2N, which is applied between the second phase conductor 12 and the neutral conductor 14, and the voltage V3N, which is applied between the third phase conductor 13 and the neutral conductor 14, are applied to adapter 22.

The adapter 22 also has at least two third electrical terminals which can be electrically connected to the at least two first electrical terminals of the energy meter 21. In the exemplary embodiment shown, the adapter 22 has the four third electrical terminals 54 to 57. The electrical terminal 54 is connected to the terminal 70 of the energy meter 21 via the connecting line 170, the terminal 55 is connected to the terminal 71 of the energy meter via the connecting line 171, the electrical terminal 56 is connected to the terminal 73 of the energy meter via the connecting line 172, while the terminal 57 is connected to the terminal 73 of the energy meter 21 via the connecting line 173.

Figure 5:
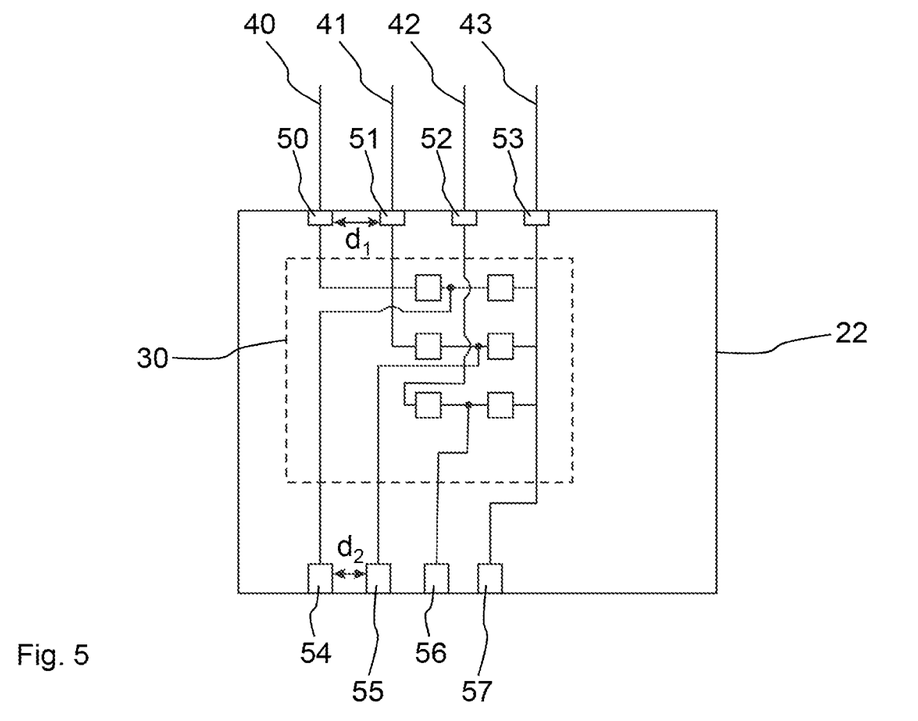

The adapter 22 also has a voltage converter 30, which can be seen in FIG. 5. The voltage converter 30 is electrically connected to the second electrical terminals 50 to 53 and the third terminals 54 to 57 of the adapter 22. The voltage converter 30 is designed to convert a first voltage which can be applied to the at least two second electrical terminals of the adapter 22 to a lower second voltage that is applied to the at least two third electrical terminals of the adapter 22.

According to one exemplary embodiment, the voltage converter 30 can have three voltage dividers. The first voltage divider has, for example, two series-connected resistors 31 and 32 which are connected between the terminals 50 and 53. The center tap of the first voltage divider is electrically connected to the terminal 54 of the adapter 22. The second voltage divider has, for example, two series-connected resistors 33 and 34. The second voltage divider is connected between the terminals 51 and 53. The center tap of the second voltage divider is connected to the terminal 55 of the adapter 22. The voltage divider has, for example, two series-connected resistors 35 and 36. The third voltage divider is connected to terminals 52 and 53. The center tap of the third voltage divider is electrically connected to the terminal 56. The terminals 53 and 57 of the adapter 22 are electrically connected to one another. In this way, the voltages V1N, V2N, and V3N of the power network 10 are each applied to the corresponding second electrical terminals 50 to 53 of the adapter 22 and converted to a lower voltage via the respective voltage divider of the voltage converter 30, wherein the reduced voltage V1N is applied to the terminals 54 and 57, the reduced voltage V2N to the terminals 55 and 57, and the reduced voltage V3N to the terminals 56 and 57. The reduced voltages are then applied to the corresponding terminals 70 to 73 of the energy meter 21 via the terminals 54 to 57 of the adapter 22 and the connecting lines 170 to 173. The voltage converter 30 converts the respective voltages according to a defined voltage ratio which is stored in the energy meter 21 for correct voltage measurement. The three voltage converters usefully convert the voltages with the same voltage ratio. It should be noted at this point that instead of the three voltage dividers, the voltage converter 30 can also contain, for example, three transformers with defined transformation ratios.

In order to be able to increase the dielectric strength of the energy measurement device 20 compared to the dielectric strength of the energy meter 21, there is a predetermined distance d1 between each two adjacent electrical terminals of the second electrical terminals 50 to 53, and this is greater than the distance d2 between adjacent terminals of the third electrical terminals 54 to 57. The distance between adjacent terminals of the first electrical terminals 70 to 73 of the energy meter 21 is preferably equal to the distance d2 between adjacent terminals of the third electrical terminals 54 to 57 of the adapter 22. Due to the energy measurement device 10, the voltages applied between the respective phase conductors and the neutral conductor of the power network 10 are thus applied to the terminals 70 to 73 of the energy meter 21 via the adapter 22, while the electrical currents flowing in the phase conductors 11 to 13 via the respective current sensors 80 to 82 are fed directly into the energy meter 21 via the terminals 61 to 66 of the three terminal pairs. The energy meter 21 is designed to measure the currents and voltages of the power network 10 in a manner known per se and to determine energy consumption therefrom.

Figure 4:
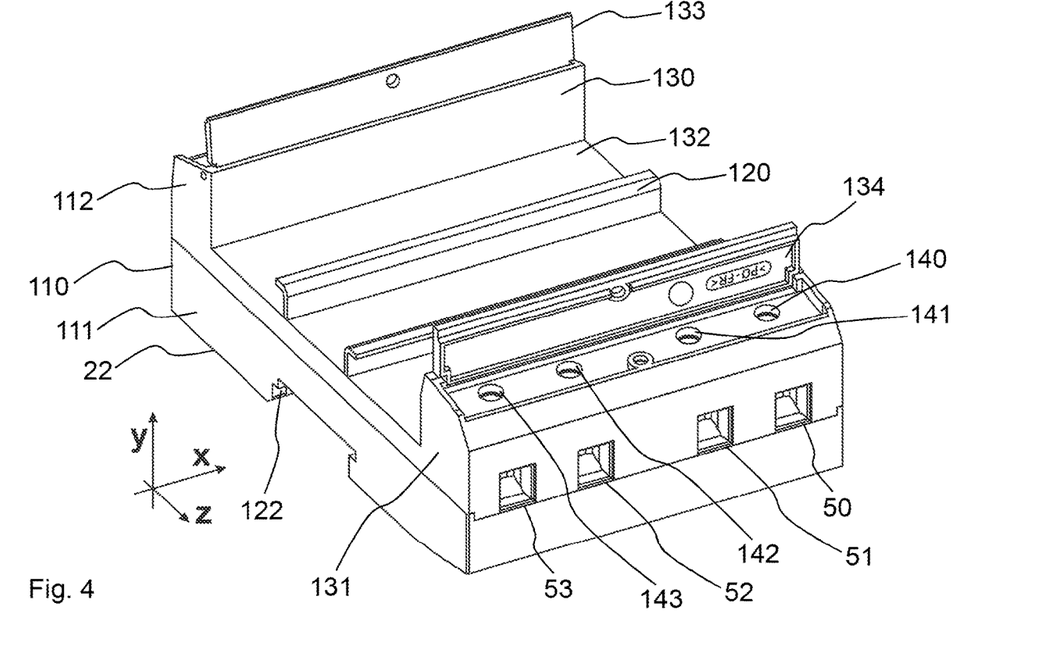
FIG. 4 depicts the adapter shown in FIG. 1 without an energy meter snapped on; and, FIG. 5 is a block diagram of an exemplary voltage converter implemented in the adapter.

FIG. 4 shows the exemplary adapter 22 without an energy meter 21 in greater detail. The adapter 22 has a housing 110, which can be realized in one piece or in several pieces. As shown by way of example, the housing 110 has, for example, a base part 111 with essentially the shape of a solid rectangle, wherein the underside can have a recess 122 which is designed such that the adapter 22 can be snapped onto the top-hat rail 90 shown in FIG. 1. The voltage converter 30 shown in FIG. 5 can be arranged in the base part 111 of the housing 110. A profiled upper part 112 can be arranged on the upper side of the base part 111 and has a flat base surface 132 that is in the X-Z plane of the coordinate system shown in FIG. 4. On two opposite sides of the upper part 112 running in the X direction, two side walls 130 and 131 extend perpendicularly from the base surface 132 in the Y direction. The base surface 132, together with the two side walls 130 and 131, forms a receiving region for receiving the energy meter 21. A mounting rail 120 running in the X direction, that is, parallel to the side walls 130 and 131, can be arranged on the flat base surface 132 of the upper part 112. The energy meter 21 can be snapped onto the mounting rail 120 of the adapter 22. Openings oriented in the Z direction and in which the electrical terminals 50 to 53 of the adapter 22 are arranged can be provided in the side wall 131. In order to be able to establish reliable contact between the connecting lines 40 to 43 and the terminals 50 to 53, openings 140-143 into each of which a screw can be inserted in order to connect the connecting lines 40 to 43 to the terminals 50 to 53 can be provided in the side wall 131. Similarly, openings oriented in the Z direction and in each of which the electrical terminals 54 to 57 of the adapter 22 are arranged can be provided in the side wall 130. In order to be able to establish reliable contact between the connecting lines 170 to 173 and the terminals 54 to 57, openings into each of which a screw can be inserted in order to connect the connecting lines 170 to 173 to the terminals 54 to 57 can be provided in the side wall 130. The openings in the side wall 130 are not visible due to the perspective illustration, however.

The openings 140 to 143 in the side wall 131 and the corresponding openings in the side wall 130 are advantageously protected against contamination, for example, by means of a flap 134 or 133.

It should be noted that the support surface of the receiving region of the adapter 22, which receiving region is defined by the base surface 132 and the two side walls 130 and 131 of the housing 110, advantageously corresponds to the cross-sectional surface area of the energy meter 21, which cross-sectional surface area spans the X and Y axes of the device shown in FIG. 1. In this way it is achieved that the overall height of the energy measurement device 10 running parallel to the Y axis of the coordinate system shown in FIG. 1 and the overall width of the energy measurement device 10 running parallel to the X axis of the coordinate system shown in FIG. 1 are equal to the overall height and overall width of the adapter 22.

Figure 2:
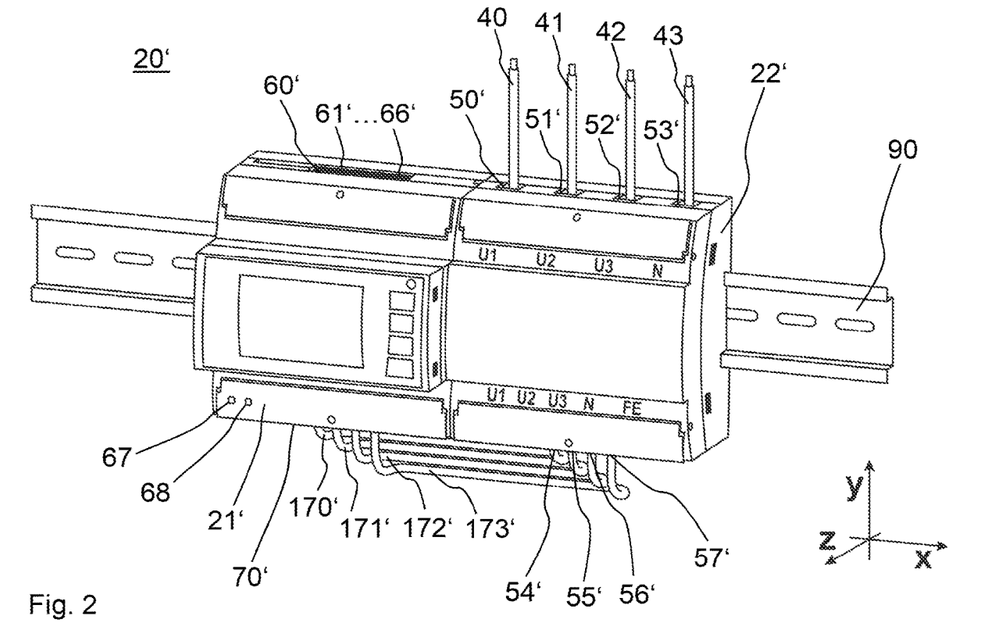
FIG. 2 depicts an exemplary arrangement of an inventive energy measurement device, wherein the energy meter and the adapter are mounted side by side on a mounting rail.

FIG. 2 shows an alternative energy measurement device 20' which has an energy meter 21' and an adapter 22' and which essentially differs from the energy measurement device 20 in FIG. 1 in that the adapter 22' has no receiving region and therefore the energy meter 21' and the adapter 22' are snapped onto the support rail 90 laterally adjacent to one another. Apart from this, the energy meter 21' can be implemented identically to the energy meter 21 and the adapter 22' can be implemented identically to the adapter 22. In other words, the voltage converter 30 shown by way of example in FIG. 5 can be implemented unchanged in the adapter 22'. In addition, similar to the energy meter 21 and the adapter 22, the energy meter 21' and the adapter 22' can be connected to the power network 10 shown in FIG. 3.

The energy meter 21' has at least two first electrical terminals for connecting to respective conductors of the power network 10. Since the exemplary power network 10 has four conductors, specifically the three phase conductors 11 to 13 and the neutral conductor 14, the energy meter 21' in the present example has the four first terminals 50' to 53', which were already mentioned in connection with FIG. 1. The electrical terminal 50' can be connected to the phase conductor 11 via the connection line 40, the electrical terminal 51' can be connected to the phase conductor 12 via the connection line 41, the electrical terminal 52' can be connected to the third phase conductor 13 via the connection line 52, and the terminal 53' can be connected to the neutral conductor 14 of the power network via the connecting line 43. The four first electrical terminals 70' to 73' of the energy meter 21' are not connected directly to the conductors 11 to 14 of the power network 10, but instead are connected electrically to the third terminals 54' to 57' of the adapter 22' via the connecting lines 170' to 173'. In a manner known per se, the energy meter 21' has at least one first electrical terminal pair for connecting an external current sensor and preferably has a second electrical terminal pair 67', 68' for connecting an external supply voltage for the energy meter 21'. In the exemplary embodiment shown, three first electrical terminal pairs are provided, specifically, the first terminal pair with the terminals 61' and 62', the second terminal pair with the terminals 63' and 64', and the third terminal pair with the terminals 65' and 66'. The first electrical terminal pair can be electrically connected to a current sensor 80 that is connected to the first phase conductor 11, the second terminal pair can be connected to a second current sensor 81 that is connected to the second phase conductor 12, while the third terminal pair can be electrically connected to a further current sensor 82 that is looped into the third phase conductor 13. As shown by way of example in FIG. 3, the current sensors 80 to 82 can each be designed as current transformers. The current flowing in the phase conductors 11 to 13 is fed directly to the energy meter 21' via the current sensors 80 to 82.

The adapter 22' has at least two second electrical terminals for connecting to respective conductors of a power network. In the exemplary installation according to FIG. 2, the adapter 22' has the four second electrical terminals 50' to 53'. The electrical terminal 50' can be connected to the first phase conductor 11 via the connecting line 40, the electrical terminal 51' can be connected to the second phase conductor 12 via the connecting line 41, the electrical terminal 52' can be connected to the third phase conductor 13 via the connecting line 42, while the terminal 53' can be connected to the neutral conductor 14 of the power network 10 via the connecting line 43. In this way, the voltage V1N which is applied between the first phase conductor 11 and the neutral conductor 14, a second voltage V2N which is applied between the second phase conductor 12 and the neutral conductor 14, and the voltage V3N which is applied between the third phase conductor 13 and the neutral conductor 14, are applied to the adapter 22'.

The adapter 22' also has at least two third electrical terminals which can be electrically connected to the at least two first electrical terminals of the energy meter 21'. In the exemplary embodiment shown, the adapter 22' has the four third electrical terminals 54' to 57'. The electrical terminal 54' is connected to the terminal 70' of the energy meter 21' via the connecting line 170', the terminal 55' is connected to the terminal 71' of the energy meter 21' via the connecting line 171', the electrical terminal 56' is connected to the terminal 73' of the energy meter 21' via the connecting line 172', while the terminal 57' is connected to the terminal 73' of the energy meter 21' via the connecting line 173'.

The invention claimed is:

1. An adapter for an energy meter, the adapter comprising: a voltage converter, at least two first electrical terminals for connecting to respective conductors of a power network, and at least two second electrical terminals for electrically connecting to an energy meter, wherein the voltage converter is electrically connected to the first electrical terminals and the second electrical terminals, wherein the voltage converter converts a first voltage, which is applied to the first electrical terminals, to a second voltage that is lower than the first voltage, the second voltage applied to the second electrical terminals, wherein a voltage ratio between the first and the second voltages is predetermined and is stored in the energy meter, and wherein a first distance between the first electrical terminals is greater than a second distance between the second electrical terminals.

2. The adapter according to claim 1, wherein:
the adapter has a receiving region which is designed to connect the energy meter to the adapter in a mechanically detachable manner.

3. An energy measurement device comprising:
an energy meter having at least two first electrical terminals for connecting to respective conductors of a power network, and at least one first electrical terminal pair for connecting an external current sensor, and
an adapter having:
a voltage converter, at least two second electrical terminals for connecting to respective conductors of the power network, and at least two third electrical terminals which are electrically connected to the first electrical terminals of the energy meter, wherein the voltage converter is electrically connected to the at least two second electrical terminals and the third electrical terminals, wherein the voltage converter converts a first voltage, which is applied to the second electrical terminals, to a second voltage that is lower than the first voltage, the second voltage applied to the third electrical terminals, wherein a voltage ratio between the first and second voltages is predetermined and is stored in the energy meter, and wherein a first distance between the second electrical terminals is greater than a second distance between the third electrical terminals.

4. The device according to claim 3, wherein:
the adapter has a receiving region which is designed to connect the energy meter to the adapter in a mechanically detachable manner, wherein the overall width and overall height of the device are determined by the overall width and overall height of the adapter.

5. The device according to claim 4, wherein:
the adapter is arranged in a housing, the receiving region is defined by the housing, a mounting rail is arranged in the receiving region, the energy meter is designed for mounting on the mounting rail of the adapter, and the housing of the adapter is designed for mounting on the mounting rail.

6. The device according to claim 3, wherein:
a distance between the at least two first electrical terminals of the energy meter is equal to the second distance between the at least two third electrical terminals.

7. The device according to claim 3, wherein:

the energy meter has three first terminal pairs for connecting one current sensor and four first electrical terminals, wherein every two adjacent terminals of the four first terminals are spaced apart by the second distance, and the adapter has four second electrical terminals and four third electrical terminals, wherein every two adjacent terminals of the four second terminals are spaced apart by the first distance and every two adjacent terminals of the four third terminals are spaced apart by the second distance.

8. The device according to claim 3, wherein:
the energy meter has a second electrical terminal pair for connecting a supply voltage for the energy meter.

* * * * *